(12) United States Patent
Duncombe et al.

(10) Patent No.: US 6,777,809 B2
(45) Date of Patent: Aug. 17, 2004

(54) BEOL DECOUPLING CAPACITOR

(75) Inventors: Peter Richard Duncombe, Peekskill, NY (US); Daniel Charles Edelstein, New Rochelle, NY (US); Robert Benjamin Laibowitz, Peekskill, NY (US); Deborah Ann Neumayer, Danbury, CT (US); Tak Hung Ning, Yorktown Heights, NY (US); Robert Rosenberg, Cortlandt Manor, NY (US); Thomas Mcarraoll Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/323,132

(22) Filed: Dec. 19, 2002

(65) Prior Publication Data

US 2003/0089943 A1 May 15, 2003

Related U.S. Application Data

(62) Division of application No. 10/055,704, filed on Jan. 22, 2002, now Pat. No. 6,525,427, which is a division of application No. 09/225,526, filed on Jan. 4, 1999, now abandoned.

(51) Int. Cl.$^7$ .............................................. H01L 23/48
(52) U.S. Cl. ........................ 257/759; 257/774; 257/776
(58) Field of Search ................................. 257/758, 759, 257/774, 776, 532, 516

(56) References Cited

U.S. PATENT DOCUMENTS

| | | |
|---|---|---|
| 4,335,505 A | 6/1982 | Shibata et al. |
| 4,786,612 A | 11/1988 | Yau et al. |
| 4,866,502 A | 9/1989 | Tomaszewski et al. |
| 4,897,153 A | 1/1990 | Cole et al. |
| 5,068,694 A | 11/1991 | Ohara |
| 5,153,689 A | 10/1992 | Okumura et al. |
| 5,258,093 A | 11/1993 | Maniar |
| 5,272,101 A | 12/1993 | Forouhi et al. |
| 5,366,920 A | 11/1994 | Yamaichi et al. |
| 5,387,812 A | 2/1995 | Forouhi et al. |
| 5,390,072 A | 2/1995 | Anderson et al. |
| 5,407,855 A | 4/1995 | Maniar et al. |
| 5,407,861 A | 4/1995 | Marangon et al. |
| 5,436,477 A | 7/1995 | Hashizumet et al. |
| 5,439,840 A | 8/1995 | Jones, Jr. et al. |
| 5,440,157 A | 8/1995 | Imai et al. |
| 5,440,174 A | 8/1995 | Nishitsuji |
| 5,566,045 A | 10/1996 | Summerfelt et al. |
| 5,587,870 A | 12/1996 | Anderson et al. |
| 5,625,232 A | 4/1997 | Numata et al. |
| 5,668,399 A | 9/1997 | Cronin et al. |
| 5,670,808 A | 9/1997 | Nishihori et al. |
| 5,708,559 A | 1/1998 | Brabazon et al. |
| 5,728,603 A | 3/1998 | Emesh et al. |
| 5,736,448 A | 4/1998 | Saia et al. |
| 5,789,303 A | 8/1998 | Leung et al. |
| 5,854,499 A | 12/1998 | Nishioka |
| 5,866,926 A | 2/1999 | Takenaka |
| 5,978,207 A | 11/1999 | Anderson et al. |
| 5,998,251 A | 12/1999 | Wu et al. |
| 6,037,664 A | 3/2000 | Zhao et al. |
| 6,104,597 A | 8/2000 | Konushi et al. |

FOREIGN PATENT DOCUMENTS

| | | |
|---|---|---|
| EP | 750354 | 11/1996 |
| JP | 05299601 | 11/1993 |
| JP | 06140737 | 5/1994 |

*Primary Examiner*—Thien F Tran
(74) *Attorney, Agent, or Firm*—Scully, Scott, Murphy & Presser; Robert M. Trepp, Esq.

(57) ABSTRACT

An amorphous dielectric material having a dielectric constant of 10 or greater is provided herein for use in fabricating capacitors in integrated circuit applications. The amorphous dielectric material is formed using temperatures below 450° C.; therefore the BEOL metallurgy is not adversely affected. The amorphous dielectric material of the present invention exhibits good conformality and a low leakage current. Damascene devices containing the capacitor of the present invention are also disclosed.

5 Claims, 6 Drawing Sheets

BEOL DECOUPLING CAPACITOR

RELATED APPLICATIONS

This application is a divisional of U.S. application No. 10/055,704, filed Jan. 22, 2002, now U.S. Pat. No. 6,525,467 which is a divisional application of U.S. application Ser. No. 09/225,526, filed Jan. 4, 1999 now abandoned.

FIELD OF THE INVENTION

The present invention relates to high-capacitance microelectronic capacitors, and more particular to an amorphous high dielectric constant thin film material which can be employed as a dielectric in capacitors formed using back-end-of-the-line (BEOL) or damascene technology. The present invention also provides novel integrated circuit (IC) damascene semiconductor devices which comprise a damascene structure and the capacitor of the present invention.

BACKGROUND OF THE INVENTION

High-capacity IC capacitors, on the order of 1 $nF/mm^2$ or above, connected across the power supply and ground buses of modern microprocessor chips are needed to reduce the power and ground noise to an acceptable level. The high-capacity capacitors should be placed very close to the switching circuits, and be connected to the power and ground buses by a low-resistance conductor. To accomplish this goal, one preferred approach is to build the high-capacity capacitors into the BEOL process.

The dielectric thin film material for such BEOL decoupling capacitors must satisfy both of the following requirements: (1) a high dielectric constant as compared to conventional dielectrics such as $SiO_2$ and $Si_3N_4$ (for example, a 100 nm thick film with a dielectric constant of 20 would give a capacitance of 1.8 $nF/mm^2$); and (2) a formation temperature which is compatible with the BEOL metallurgy and processing.

The latter criteria implies that the deposition temperature of the dielectric material used in forming the BEOL decoupling capacitor must be about 450° C. or lower. Such a low deposition temperature is required in order to avoid unwanted instability of the BEOL metallurgy used for the power and ground connections.

Although a variety of dielectric materials having high dielectric constants are known in the art, the prior art dielectrics cannot be employed in BEOL processing due to their required high deposition temperatures. An example of such a high dielectric constant material is the crystalline form of certain perovskite-type oxides. Despite having dielectric constants of about 200 or above, crystalline perovskite-type oxides are typically deposited at temperatures of about 500° C. or higher, or require a post anneal step using temperatures higher than 500° C. As such, the crystalline perovskite-type oxides such as barium strontium titanate (BSTO) cannot be employed in BEOL applications.

In view of the drawbacks mentioned hereinabove concerning prior art dielectric materials, there is a continued need to develop a dielectric material which can be employed in fabricating BEOL decoupling capacitors which meets both of the aforementioned requirements.

SUMMARY OF THE INVENTION

One object of the present invention is to provide a thin film dielectric material which can be employed in forming capacitors using the BEOL wiring levels as the capacitor electrodes.

Another object of the present invention is to provide a thin film dielectric material which has a dielectric constant higher than conventional dielectric materials such as $SiO_2$ ($\epsilon \approx 4.0$), $Si_3N_4$ ($\epsilon \approx 7.0$) and $Al_2O_3$ ($\epsilon \approx 9.0$) and which can also be formed at temperatures that are compatible with the BEOL metallurgy.

A further object of the present invention is to provide a high-capacity BEOL decoupling capacitor which has a capacity on the order of 2 $nF/mm^2$ or above.

A still further object of the present invention is to provide a thin film dielectric material which exhibits good conformality to the electrode structure and geometry to which it is applied as well as a low leakage current that is on the order of 1 $\mu A/cm^2$ or less.

A yet further object of the present invention is to provide high capacitance capacitors to damascene structures which exhibit low leakage current.

These and other objects and advantages are achieved in the present invention by utilizing an amorphous perovskite-type oxide as a thin film dielectric material. Specifically, the present invention relates to high-capacitance capacitors formed using thin film materials which are in the amorphous phase as the dielectric material in capacitors formed using the BEOL wiring levels as the capacitor electrodes in the integrated-circuit chip. These wiring levels include the power and ground levels. As such, the capacitors can be placed in close proximity to the switching circuits and provide effective filtering and noise reduction.

At the BEOL level, ambient temperatures must be kept low, less than about 450° C., thus the novel capacitors of this invention use a low temperature deposition and annealing process to stay at or below this temperature. This ensures formation of a dielectric material which is in the amorphous phase. It has been determined that the amorphous phase of barium strontium titanate (BSTO) has a dielectric constant of up to about 25 or more which value is significantly higher than that of the typical dielectrics used in circuit applications. Other perovskite-type oxides such as lead lanthanum titanate (PLTO), barium zirconium titanate (BZTO) and tantalum titanate (TTO) can have even greater dielectric constants in their amorphous phase. Capacitors formed utilizing these particular types of amorphous dielectrics also exhibit low leakage and good conformality.

In another aspect of the present invention, the capacitors of the present invention are used in fabricating novel IC damascene semiconductor devices. In this embodiment, the capacitor can be fabricated on the outermost wiring level of the damascene structure, on wiring levels beneath the outermost wiring level, or in a trench which is formed in the interlevel dielectric of the damascene structure.

DETAILED DESCRIPTION OF THE INVENTION

Figure 1:
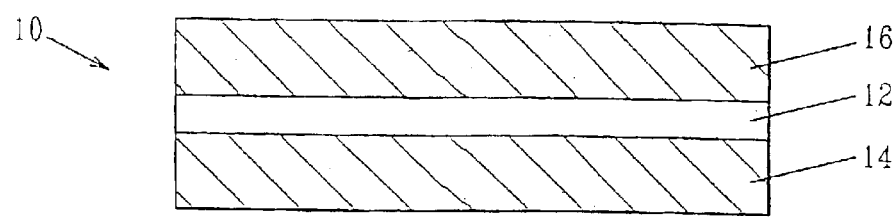
FIG. 1 is a cross-sectional view of a metal/insulator/metal, i.e. decoupling, capacitor 10 of the present invention, wherein amorphous dielectric film 12 is sandwiched between conducting electrodes 14 and 16.

The present invention which provides an amorphous thin film dielectric material having a dielectric constant of greater than 10 for use in fabricating high-capacity capacitors in BEOL processing will now be described in greater detail by referring to the drawings that accompany this application. It should be noted that in the drawings like reference numerals are used for like and corresponding elements.

Referring first to FIG. 1, there is shown a cross-sectional view of a metal/insulator/metal, i.e. decoupling, capacitor 10 of the present invention. Specifically, decoupling capacitor 10 of FIG. 1 comprises an amorphous dielectric thin film 12 that is sandwiched between electrodes 14 and 16. The electrodes shown in FIG. 1 comprise the power ($V_{dd}$) and ground wiring ($G_{nd}$) levels, respectively, fabricated near the end of the integrated circuit fabrication process, i.e. BEOL. The electrodes are composed of conventional conductive materials including, but not limited to: TaN, Pt, Ir, ruthenium oxide, Al, Au, Cu, Ta, TaSiN and mixtures or multilayers thereof. Other conventional conductive materials can also be employed in the present invention. Moreover, the electrodes are fabricated in accordance with BEOL processing which is well known to those skilled in the art including deposition and patterning.

The amorphous high dielectric constant thin film 12 of the present invention is composed of a perovskite-type oxide. The term "perovskite-type oxide" is used herein to denote a material which includes at least one acidic oxide containing at least one metal selected from Group IVB (Ti, Zr or Hf), VB (V, Nb or Ta), VIB (Cr, Mo or W), VIIB (Mn or Re) or IB (Cu, Ag or Au) of the Periodic Table of Elements (CAS version) and at least one additional cation having a positive formal charge of from about 1 to about 3. Such perovskite-type oxides typically have the basic formula: $ABO_3$ wherein A is one of the above mentioned cations, and B is one of the above mentioned metals.

Suitable perovskite-type oxides include, but are not limited to: titanate-based dielectrics, manganate-based materials, cuprate-based materials, tungsten bronze-type niobates, tantalates, or tibanates, and bismuth layered-tantalates, niobates or titanates. Of these perovskite-type oxides, barium strontium titanate (BSTO), barium titanate (BTO), lead zirconium titanate (PZTO), barium zirconium titanate (BZTO), tantalum titanate (TTO), lead lanthanum titanate (PLTO), barium strontium niobate, barium strontium tantalate or strontium titanate (STO) are preferred in the present invention. A highly preferred perovskite-type oxide is BSTO or BZTO.

It is again emphasized that the perovskite-type oxide employed in the present invention must be in the amorphous (or low temperature) phase since the crystalline phase of such materials is produced at temperatures which are not compatible with the BEOL processing. The term "amorphous phase" is used herein to denote that the crystal structure of the perovskite-type oxide lacks order. This is different from the crystalline phase of the material wherein a highly ordered crystal structure is observed.

The amorphous thin film dielectric material of the present invention is formed by a suitable deposition process which is capable of operating at temperatures well below the crystallization temperature of the perovskite-type oxide and thereafter, the deposited material is annealed.

Typically the temperature of deposition of the amorphous thin film dielectric material is kept below 400° C. and thus the process and the material is compatible with BEOL temperature requirements. In some applications higher BEOL temperatures may be allowed, up to 450° C. or even 500° C. The amorphous thin film dielectric materials of the present invention retain their properties to well above 500° C., i.e., their amorphous to crystalline transformation occurs well above 500° C.

Suitable deposition processes that can be employed in the present invention in forming the amorphous thin film dielectric material include, but are not limited to: chemical vapor deposition (CVD), physical vapor deposition (PVD), plasma-assisted CVD, low pressure CVD, high density plasma CVD, ionized-PVD as well as chemical solution deposition (CSD). A sol gel technique can also be employed in the present invention to form the amorphous thin film dielectric material of the present invention.

The annealing step used in forming the amorphous thin film dielectric material of the present invention is conducted at a temperature of from about 150° to about 450° C. for a time period of from about 0.1 to about 4 hrs. More preferably, annealing is carried out at a temperature of from about 300° to about 400° C. for a time period of from about 0.5 to about 4 hrs. Oxidizing gases such as oxygen, $N_2O$, ozone or mixtures such as air may be employed in the annealing step.

The exact conditions employed in forming the amorphous thin film dielectric material of the present invention may vary depending on the specific technique employed. The only critical limitation is that the deposition and annealing temperatures be below the crystalline temperature of the perovskite-type oxide. The term "thin film" is used herein to denote that the deposition process provides a highly conformal layer of the amorphous phase of the perovskite-type oxide. Typically, the thickness of the amorphous thin dielectric material ranges from about 25 to about 500 nm. More preferably, the thickness of the amorphous thin film dielectric material of the present invention is in the range of from about 50 to about 200 nm.

The dielectric constant, $\epsilon$, of the amorphous thin film dielectric material of the present invention is about 10 or greater. More preferably, the amorphous thin film dielectric material of the present invention has a dielectric constant of from about 14 to about 50.

Although the dielectric constants of the amorphous thin film dielectric material of the present invention are lower than the corresponding crystalline phase of the material, the amorphous dielectric materials of the present invention have dielectric constants which are significantly higher than the typical nitrides and oxides of silicon that are used in most integrated circuits. As stated above, the amorphous thin film dielectric material of the present invention can be fabricated at temperature below 450° C.; therefore, the amorphous thin film material is compatible with BEOL temperature requirements, especially when Al and Cu based metallurgies are employed.

Figure 2:
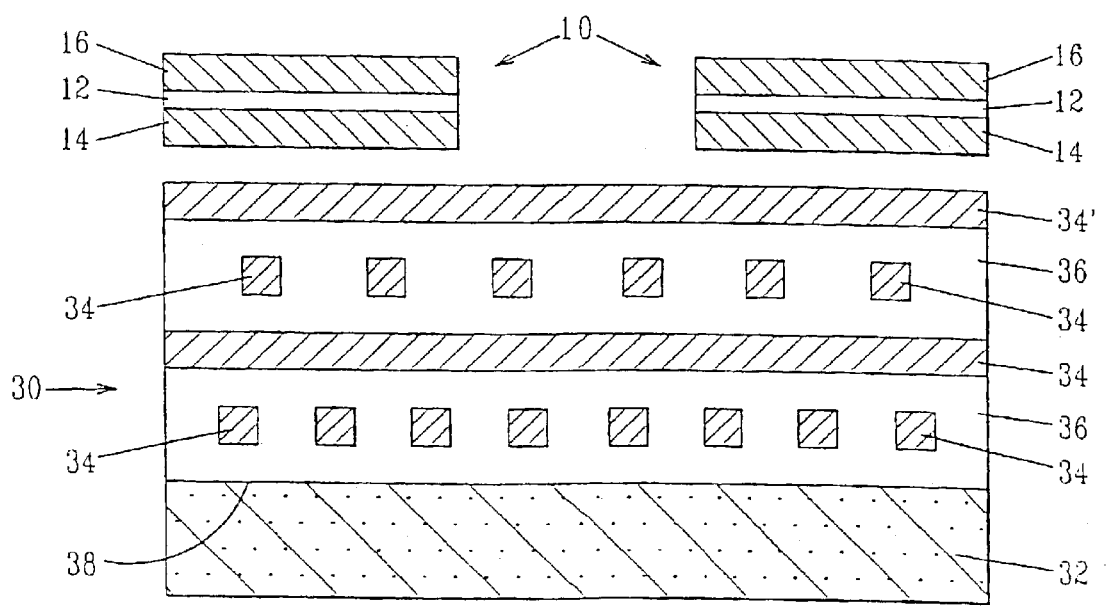
FIG. 2 is a cross-sectional view of the decoupling capacitor of FIG. 1 placed in proximity to integrated circuit chip 30.

The capacitor of FIG. 1 can be used in conjunction with integrated circuit chip 30, as shown in FIG. 2, by fabricating capacitor 10 over the wiring levels of the chip. The integrated circuit chip shown in FIG. 2 comprises a semiconductor substrate 32, multiple wiring (or interconnect) levels 34, and various levels composed of a low dielectric constant material or insulator 36 such as oxides like $SiO_2$ or nitrides like $Si_3N_4$. Other conventional inorganic insulators or organic insulators having a dielectric constant below 10 can also be employed in the present invention. It is noted that in FIG. 2, capacitor 10 of FIG. 1 represented by layers 16, 14 and 12 is shown above integrated circuit chip 30. The drawing is illustrated in that fashion so as to depict that capacitor 10 can be fabricated on top of the upper wiring level 34' or on any other wiring levels that may be formed between upper wiring level 34' and electrode 14 of the capacitor. The other wiring levels are not shown in FIG. 2, but if present, they would exist between upper wiring level 34' and electrode 14 of the capacitor.

The capacitor of FIG. 1 is fabricated in close proximity with the active device areas of chip 30; therefore providing excellent filtering and noise reduction to the integrated circuit chip. Moreover, the power-to-ground voltage can be maintained at a relatively constant level as the circuit switch, i.e. the power and ground, is decoupled from the switching of the circuit. Since temperatures below about 450° C. are used in fabricating the capacitor, the integrity of the wiring levels 34 is not compromised. The active device areas mentioned above are formed in chip surface 38. For clarity, the active device areas are not shown in the drawings. It should be noted that the processing step used in forming the integrated circuit chip of FIG. 2 are conventional and well known to those skilled in the art. Thus, a detailed description of the same is not needed herein.

The capacitor, wiring levels, and chip configurations as shown in FIG. 2 can be fabricated in an actual circuit layout in several preferred embodiments, some examples are shown in FIGS. 3–4, respectively. It should be noted that in FIG. 2, the capacitor is arranged vertically, i.e. conductors are formed above and below the amorphous high dielectric constant thin film of the present invention, whereas in FIGS. 3–4 that follow, the capacitor is formed horizontally, i.e. the amorphous layer is positioned adjacent to a conductive region defining the electrode.

Figure 3A:
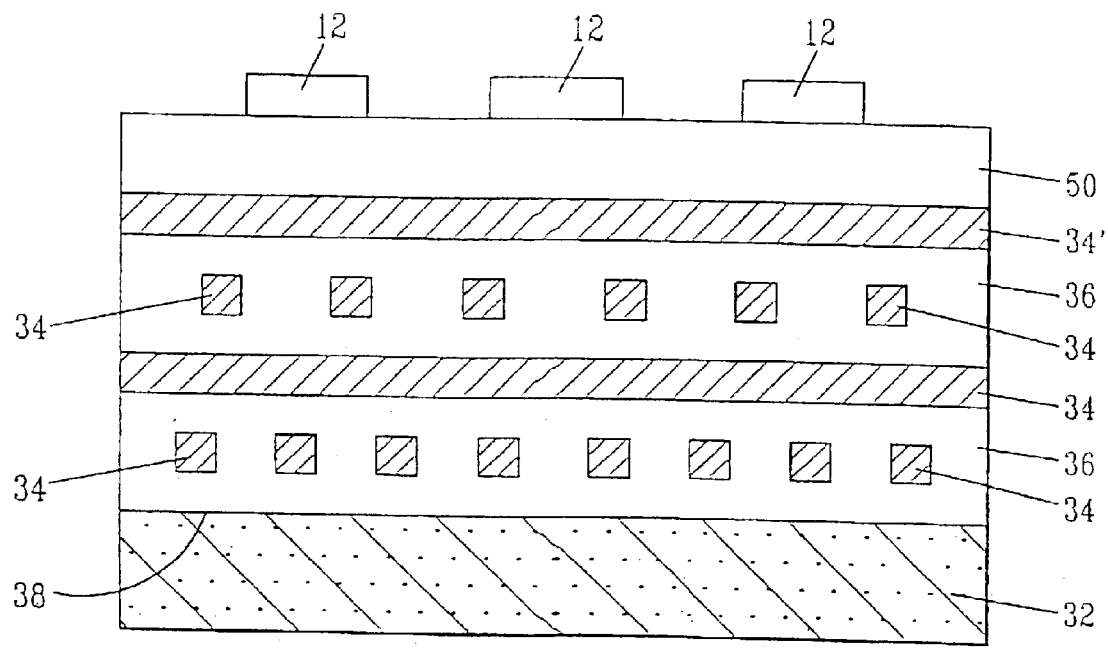
FIGS. 3(a)–(b) are cross-sectional views illustrating the various processing steps used in forming a BEOL capacitor of the present invention; lithography and dry etching are used first to produce the finger-like structure shown in 3(a), and a metal fill process is used to fill the spaces between each finger-like protrusion to produce the horizontal BEOL capacitor shown in FIG. 3(b).
Figure 3B:
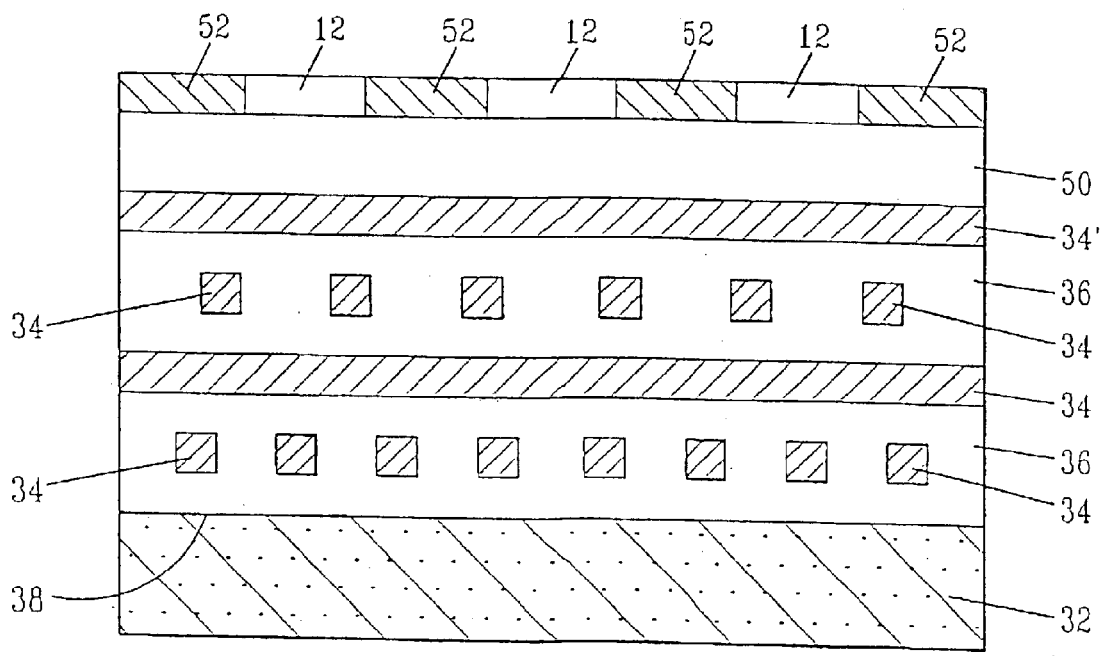

In FIGS. 3(a)–(b), there are shown various processing steps that can be used in forming a horizontal decoupling capacitor wherein a structure containing finger-like regions, i.e. patterned amorphous thin film dielectric regions 12, are first formed and then the spaces between the finger-like protrusions are filled with a metal 52. Finger-like regions are implemented in the present invention since the same increase the total capacitance of the overall structure, particularly the fringe electric field of the structure is increased.

Specifically, in FIG. 3(a), an amorphous thin film dielectric material 12 of the present invention is formed on a low dielectric constant material or insulating material 50 using the process described hereinabove. The low dielectric constant material or insulating layer 50 are part of an integrated circuit chip which contains semiconductor substrate 32, low dielectric constant or insulating layers 36 and multiple wiring levels 34. Insulating layer 50 includes the same low dielectric constant materials mentioned above in regard to insulating layers 36.

The amorphous thin film is then patterned using standard lithography and dry etching such as reactive ion etching (RIE) to provide discrete patterned regions of the amorphous thin film dielectric material on the insulating material. The horizontal decoupling capacitor is then completed by filling in the spaces between amorphous thin film dielectric material 12 with a metal, i.e. conducting material, 52 used for the power and ground levels, see FIG. 3(b). It is noted that the conductive material used in forming metal regions 52 is the same as that previously mentioned for electrodes 14 and 16. In these figures, the amorphous dielectric material is in the plane of the power and ground wiring levels providing high capacitance between power and ground. Additional wiring levels are shown separated by appropriate insulators.

Figure 4A:
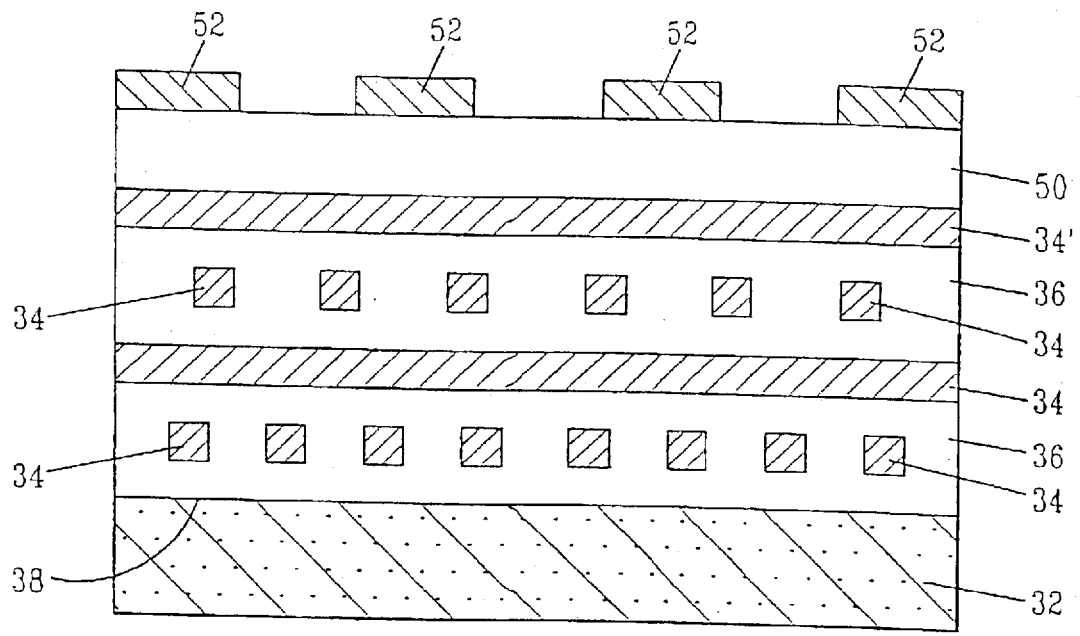
FIGS. 4(a)–(b) are cross-sectional views illustrating the various processing steps used in forming a BEOL capacitor of the present invention; patterning is first used to provide the metal fingers shown in FIG. 4(a); and then the method of the present invention is used to fill the spaces between the patterned metal regions to produce the structure shown in FIG. 4(b).
Figure 4B:
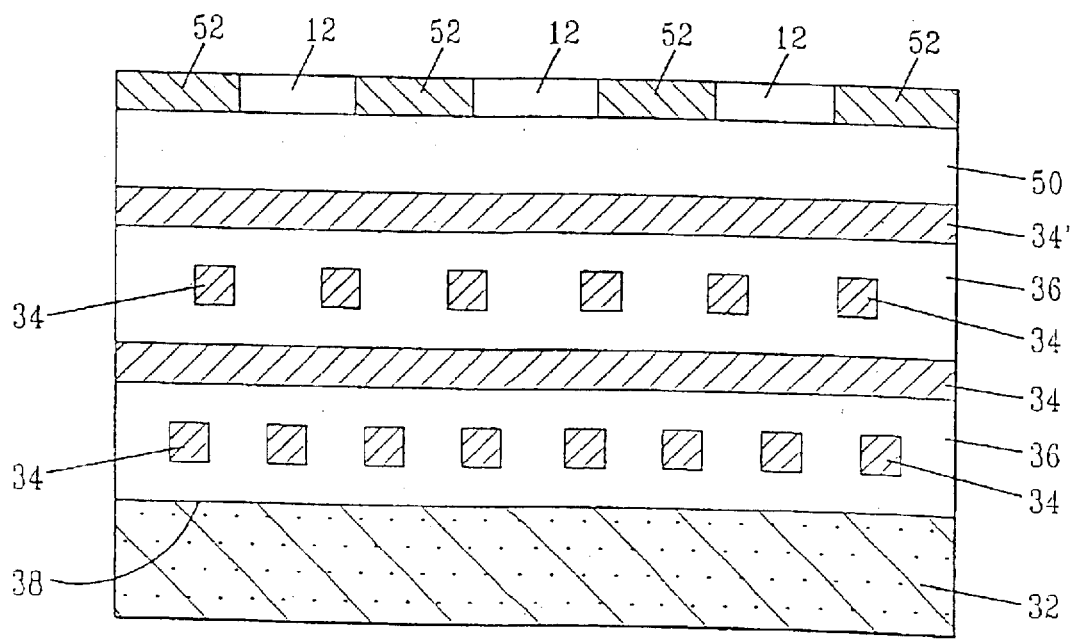

FIGS. 4(a)–(b) show an alternative embodiment of the present invention wherein a structure having patterned metal regions is first formed and then the spaces between the metal regions are filled with the amorphous thin film dielectric material of the present invention. Specifically, in this case, the metal 52 for the power and ground leads is first deposited and then patterned using conventional techniques well known to those skilled in the art; and thereafter the spaces are filled with the amorphous thin film dielectric material of the present invention.

Any excess metal or dielectric can be removed or planarized by polishing or other techniques. The steps for forming the capacitors of FIGS. 3(a)–(b) and 4(a)–(b) may then be repeated to form a second set of capacitors above the first set. Both sets of capacitors are close to the device levels for efficient decoupling purposes.

Figure 5A:
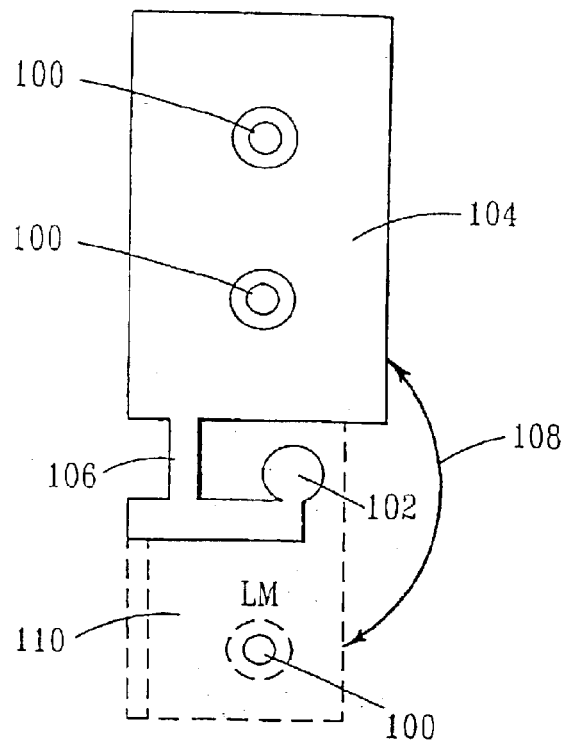
FIGS. 5(a)–(b) are (a) top and (b) side views of an IC damascene semiconductor device wherein the capacitor is formed on the outermost, i.e. last, wiring level.
Figure 5B:
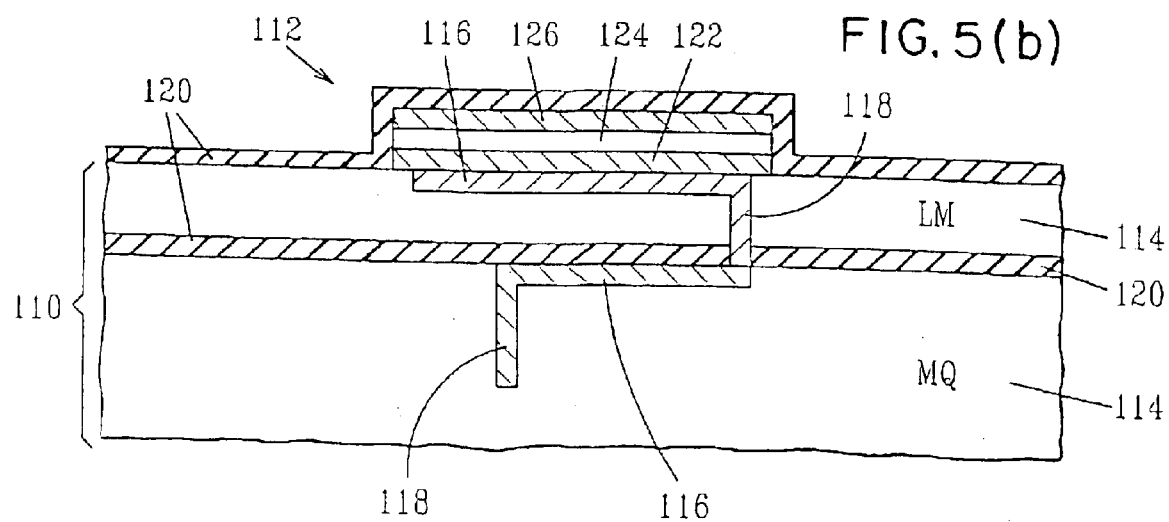

In regard to FIGS. 5(a)–(b) there are shown top and side views, respectively, of a damascene semiconductor device which includes a capacitor formed on the outermost wiring level of the damascene structure. Specifically, in FIG. 5(a), a top view is illustrated. The structure shown in FIG. 5(a) comprises $G_{nd}$ regions 100, $V_{dd}$ region 102, an upper electrode 104, a fuse 106, a power strap/decoupling capacitor 108 and a lower electrode 110. A metal fuse is employed in the present invention to separately connect segments of the upper electrode of the decoupling capacitor to its voltage supply. A side view of the structure of FIG. 5(a) is shown in FIG. 5(b). Specifically, the structure shown in FIG. 5(b) comprises a damascene structure 112 which various dielectric interlevels 114, wiring levels 116 and vias 118 which are used to interconnect the various wiring levels. Cap layers 120 are formed on top of the various wiring levels. The structure also includes a patterned capacitor stack region which includes a lower electrode 122, an amorphous high dielectric constant thin film layer 124 which is formed using the method of the present invention and an upper electrode 126.

The structure shown in FIGS. 5(a) and (b) is fabricated using the following processing steps: First, the damascene structure is fabricated using conventional damascene processing steps well known to those skilled in the art which are capable of providing a structure containing multiple insulator layers and wiring levels, wherein vias are used to interconnect the various wiring levels.

After, fabricating the damascene structure, a layer of conductive material 122 is formed on the surface of the last metal wiring level (LM). This layer can be referred to as lower electrode 122 of the capacitor. The conductive materials and the methods of depositing the same are the same as those mentioned previously hereinabove. A preferred conducting material for layer 122 is TaN.

Next, a layer of amorphous high dielectric constant material 114 is formed on the surface of the conducting material using the materials and conditions mentioned above. Another layer of conductive material 126, which may be the same or different from the conductive material used in forming the lower electrode, is then formed over the layer of amorphous high dielectric constant thin film material. A highly preferred conductive material used in forming the upper electrode 126 of the capacitor is a mixture of Ta and TaN.

After deposition of the various layers, lithography and dry etching are employed, cap layer 120 is then formed on the surface of the patterned capacitor region. Sidewall spacers, not shown in the drawings, may optionally be formed on each side of the patterned capacitor region.

Figure 6A:
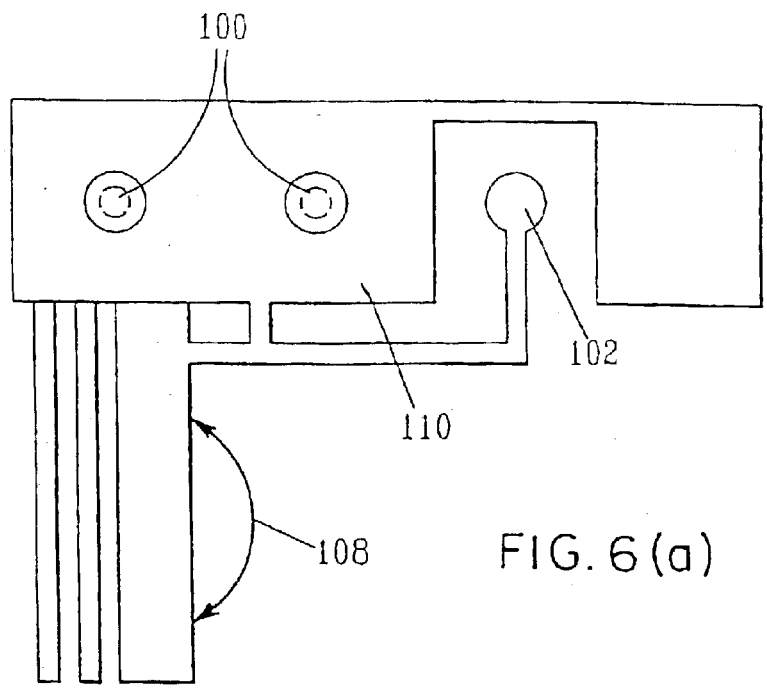
FIGS. 6(a)–(b) are (a) top and (b) side views of an IC damascene semiconductor device wherein the capacitor is formed on the wiring level underlying the outermost wiring level.
Figure 6B:
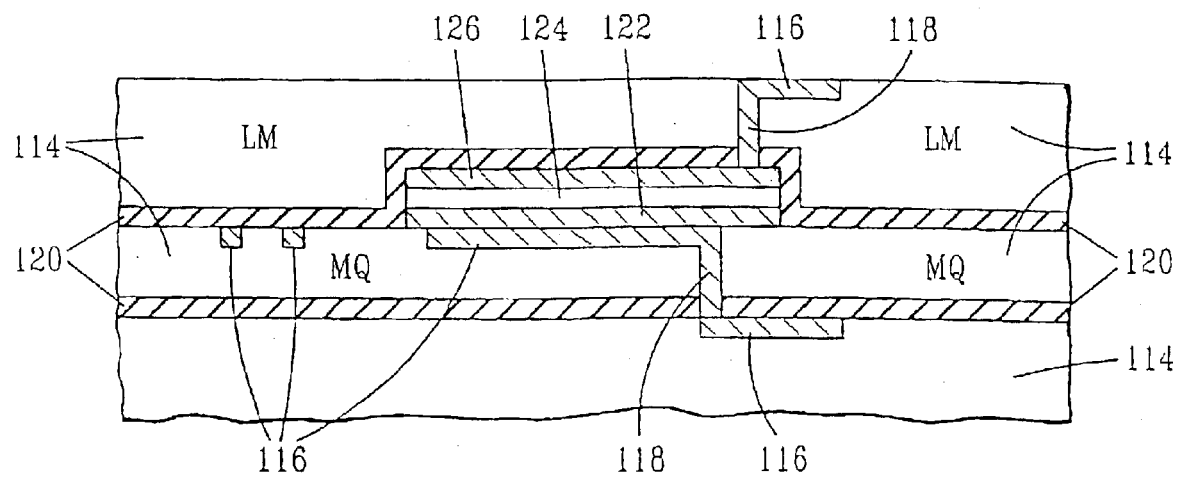

FIGS. 6(a)–(b) illustrate another embodiment of the present invention wherein the capacitor is formed in the wiring level (MQ) which is beneath the outermost wiring level (LM). FIGS. 6(a) is a top view of the structure and (b) is the side view of the structure. In FIG. 6(a), the structure comprises $V_{dd}$ region 102, $G_{nd}$ regions 100 which are formed in the upper most wiring level (LM) 116 of the damascene structure. The structure also includes a connection 126 from $V_{dd}$ region 102 to lower electrode 120, a lower MQ/electrode plate 128 and a power strap/decapacitor 108.

The side view of the structure includes the same elements as those mentioned and labeled in FIG. 5(b). The structure is formed using the following processing sequence: First, a damascene structure containing various dielectric interlevels 114, wiring levels 116 and vias 118 is fabricated. Next, the various layers forming the capacitor are formed and then the a patterned stacked capacitor is provided using the above described techniques.

A cap layer 120 is then formed over the stacked capacitor and exposed regions of the damascene structure. A via 118 is then formed through the various layers including cap layer 120 and patterned stacked capacitor to provide an interconnection with the underlying wiring level. The via is filled with a conducting material and planarized. Next, a dielectric material is formed over the entire structure and it is patterned and etched to provide a wiring region which is thereafter filled with an appropriate conductive metal. A outer cap layer 120 is then formed over the entire structure providing the structure shown in FIG. 6(b). Optionally, sidewall spacers may be formed on each side of the patterned decoupling capacitor.

Figure 7A:
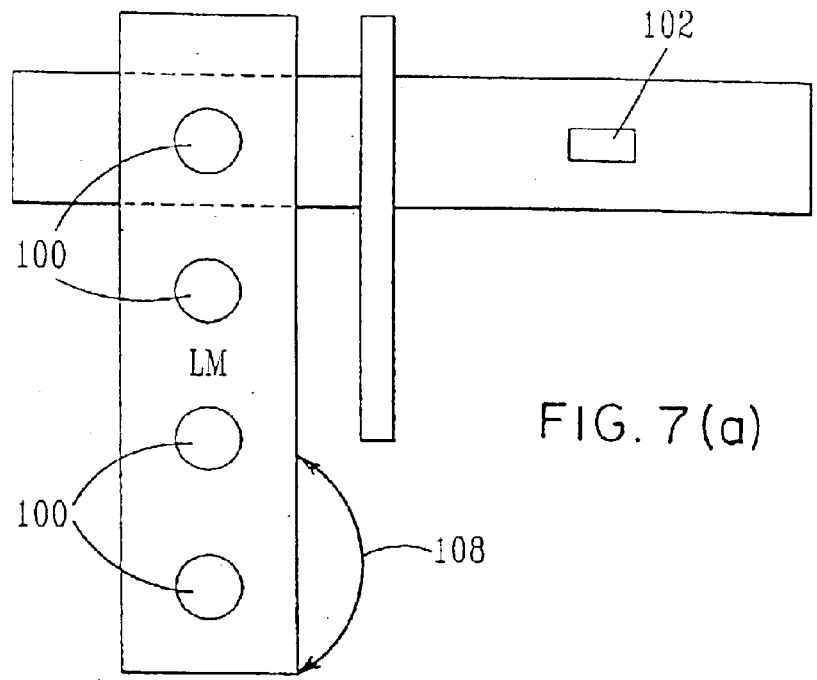
FIGS. 7(a)–(b) are (a) top and (b) side views of an IC damascene semiconductor device wherein the capacitor is formed in a trench formed in the last interlevel dielectric layer.
Figure 7B:
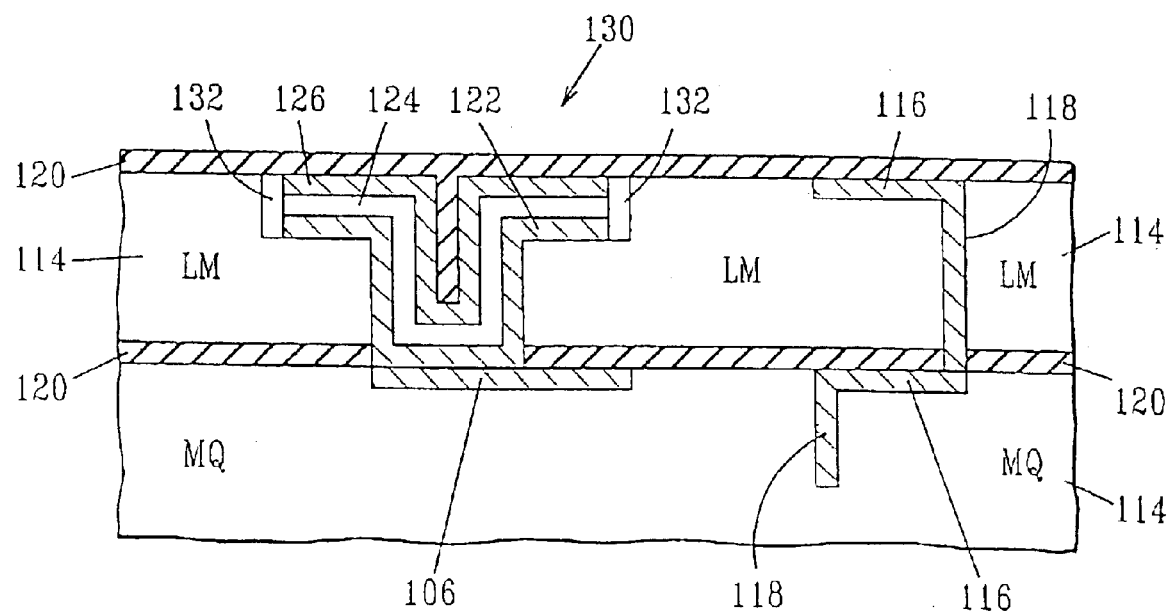

FIGS. 7(a)–(b) show an additional embodiment of the present invention wherein the patterned stack capacitor is formed in a damascene trench formed in the dielectric interlevel. Those elements that are the same are those previously mentioned above contain like reference numerals. The structure comprises a damascene structure having various dielectric interlevels 114, wiring levels 116 and vias 118 to interconnect the same. The capacitor is formed in a trench region 130 of the outermost insulator layer and a spacer 132 is employed to separate the capacitor from the underlying wiring level. The structure is fabricated as follows: A damascene structure through the via/outermost wiring level is first fabricated. The structure contains trench region 130. Next, the various layers forming the capacitor are deposited and the capacitor is patterned as before. A sidewall spacer 132 such as $Si_3N_4$ or $SiO_2$ is then formed and patterned using conventional methods well known to those skilled in the art. The trench is the filled with a suitable conducive metal, planarized and a cap layer is then formed over the outermost wiring level of the damascene structure providing the structure shown in FIG. 7(b).

While this invention has been particularly described with respect to preferred embodiments thereof, it will be understood by those skilled in the art that the foregoing and other changes in form and detail may be made without departing from the spirit and scope of the present invention.

Having thus described our invention in detail, what we claims as new, and desire to secure by the Letters Patent is:

1. A semiconductor device comprising a damascene structure, said damascene structure including alternating dielectric interlevels and wiring levels, wherein each of said wiring levels are interconnected by vias and contain a cap layer thereon; and a patterned decoupling capacitor formed over the wiring level underlying the outermost wiring level, said patterned stack decoupling capacitor comprising a bottom electrode, an amorphous high dielectric constant thin film and an upper electrode, said upper electrode being interconnected with said outermost wiring level by a via.

2. The IC semiconductor device of claim 1 further comprising a metal fuse for separately connecting segments of said upper electrode to its voltage supply.

3. The IC semiconductor device of claim 1 further comprising sidewall spacers on each side of the patterned decoupling capacitor.

4. The semiconductor device of claim 1 wherein said amorphous high dielectric constant thin film is a perovskite-type oxide.

5. The semiconductor device of claim 4 wherein said perovskite-type oxide is a titanate-based dielectric, a manganate-based material, a cuprate-based material, a tungsten bronze-type material, or a bismuth layered material.

* * * * *